United States Patent
Morgott et al.

(10) Patent No.: US 11,205,641 B2
(45) Date of Patent: Dec. 21, 2021

(54) OPTOELECTRONIC COMPONENT

(71) Applicant: OSRAM OLED GmbH, Regensburg (DE)

(72) Inventors: Stefan Morgott, Pentling (DE); Wolfgang Schnabel, Langquaid (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/753,347

(22) PCT Filed: Sep. 20, 2018

(86) PCT No.: PCT/EP2018/075451
§ 371 (c)(1),
(2) Date: Apr. 3, 2020

(87) PCT Pub. No.: WO2019/068471
PCT Pub. Date: Apr. 11, 2019

(65) Prior Publication Data
US 2020/0286868 A1    Sep. 10, 2020

(30) Foreign Application Priority Data
Oct. 4, 2017 (DE) ............. 10 2017 122 936.1

(51) Int. Cl.
*H01L 25/075* (2006.01)
*H05B 45/20* (2020.01)
(Continued)

(52) U.S. Cl.
CPC ......... *H01L 25/0753* (2013.01); *H01L 33/50* (2013.01); *H01L 33/62* (2013.01); *H05B 45/20* (2020.01)

(58) Field of Classification Search
CPC combination set(s) only.
See application file for complete search history.

(56) References Cited

U.S. PATENT DOCUMENTS 9,609,715 B1 * 3/2017 Petluri ............... C09K 11/7774
2007/0223219 A1 * 9/2007 Medendorp, Jr. ... C09K 11/7734
362/231
(Continued)

FOREIGN PATENT DOCUMENTS

DE    102007058700 A1    3/2009
WO    2012084451 A1    6/2012
(Continued)

OTHER PUBLICATIONS

International Search Report issued for the counterpart international application No. PCT/EP2018/075451, dated Nov. 8, 2018, 4 pages (for reference purpose only).
(Continued)

*Primary Examiner* — Ratisha Mehta
(74) *Attorney, Agent, or Firm* — Viering, Jentschura & Partner MBB

(57) ABSTRACT

An optoelectronic component may include four semiconductor chips arranged on a substrate. A first semiconductor chip may be configured to emit electromagnetic radiation with a dominant wavelength ranging from about 610 to about 650 nm during operation. A second semiconductor chip may be configured to emit electromagnetic radiation with a dominant wavelength ranging from about 450 to about 475 nm during operation. A third semiconductor chip may be configured to emit electromagnetic radiation with color space coordinates of 0.3231±0.005 and 0.5408±0.005 in the CIE color space during operation. A fourth semiconductor chip may emit electromagnetic radiation having color space coordinates of 0.5638±0.005 and 0.4113±0.005 in the CIE color space during operation. The third and fourth semiconductor chips may have a conversion layer configured to convert a wavelength of the electromagnetic radiation emitted by the active region.

11 Claims, 16 Drawing Sheets

(51) Int. Cl.
*H01L 33/50* (2010.01)
*H01L 33/62* (2010.01)

(56) References Cited

U.S. PATENT DOCUMENTS

| | | | |
|---|---|---|---|
| 2012/0043552 A1* | 2/2012 | David | C09K 11/7721 257/76 |
| 2013/0056765 A1* | 3/2013 | Thompson | H01L 27/15 257/88 |
| 2013/0320369 A1 | 12/2013 | Gaertner et al. | |
| 2014/0225137 A1* | 8/2014 | Krames | H01L 25/0753 257/89 |
| 2017/0223799 A1 | 8/2017 | Petluri et al. | |
| 2017/0263827 A1* | 9/2017 | Eun | B05C 11/10 |
| 2017/0278829 A1 | 9/2017 | Stoll et al. | |

FOREIGN PATENT DOCUMENTS

| | | |
|---|---|---|
| WO | 2016034480 A1 | 3/2016 |
| WO | 2017131697 A1 | 8/2017 |

OTHER PUBLICATIONS

Search Report issued for the counterpart German application No. 10 2017 122 936.1, dated May 28, 2018, 6 pages (for reference purpose only).

* cited by examiner

| | 11 | 12 | 13 | 14 | total | Ra | R9 |
|---|---|---|---|---|---|---|---|
| 3000K | 12,1% | 55,6% | 1,4% | 30,9% | 100,0% | 97 | 96 |
| 4000K | 8,8% | 62,7% | 3,0% | 25,5% | 100,0% | 98 | 95 |
| 5000K | 7,0% | 66,6% | 4,3% | 22,1% | 100,0% | 96 | 97 |
| 6000K | 6,5% | 70,4% | 5,2% | 17,9% | 100,0% | 96 | 93 |
| 7000K | 5,6% | 70,4% | 6,3% | 17,8% | 100,0% | 95 | 93 |

OPTOELECTRONIC COMPONENT

CROSS-REFERENCE TO RELATED APPLICATIONS

The present application is a national stage entry according to 35 U.S.C. § 371 of PCT application No.: PCT/EP2018/075451 filed on Sep. 20, 2018; which claims priority to German Patent Application Serial No.: 10 2017 122 936.1, which was filed on Oct. 4, 2017; which are incorporated herein by reference in their entirety and for all purposes.

TECHNICAL FIELD

An optoelectronic component is specified.

BACKGROUND

An object to be achieved is to specify an optoelectronic component which can be operated efficiently.

SUMMARY

In accordance with at least one embodiment of the optoelectronic component, the optoelectronic component includes a first semiconductor chip. The first semiconductor chip is designed to emit electromagnetic radiation, in particular light, during operation. The first semiconductor chip is for example a luminescence diode chip such as a light emitting diode chip or a laser diode chip.

In accordance with at least one embodiment of the optoelectronic component, the optoelectronic component includes a second semiconductor chip. The second semiconductor chip is designed to emit electromagnetic radiation, in particular light, during operation. The second semiconductor chip is for example a luminescence diode chip such as a light emitting diode chip or a laser diode chip.

In accordance with at least one embodiment of the optoelectronic component, the optoelectronic component includes a third semiconductor chip. The third semiconductor chip is designed to emit electromagnetic radiation, in particular light, during operation. The third semiconductor chip is for example a luminescence diode chip such as a light emitting diode chip or a laser diode chip.

In accordance with at least one embodiment of the optoelectronic component, the optoelectronic component includes a fourth semiconductor chip. The fourth semiconductor chip is designed to emit electromagnetic radiation, in particular light, during operation. The fourth semiconductor chip is for example a luminescence diode chip such as a light emitting diode chip or a laser diode chip.

In accordance with at least one embodiment of the optoelectronic component, the semiconductor chips are arranged on a carrier. The carrier can be for example a printed circuit board. It is possible, moreover, for the carrier to be an electrically conductive frame (called: "leadframe") or for the carrier to include such a frame.

Each of the semiconductor chips can be arranged in a respectively dedicated package. The packages can be applied to the carrier. Furthermore, the four semiconductor chips can be arranged in a common package applied to the carrier. Furthermore, it is possible for some or all of the semiconductor chips to be unpackaged and secured directly on the carrier.

The semiconductor chips can each have a main plane of extent that is parallel to a main plane of extent of the carrier. In the main plane of extent of the four semiconductor chips, the latter can have the shape of a rectangle or of a square. If the four semiconductor chips each have the shape of a square in the main plane of extent, then the square can have an area of at least 0.5 mm$^2$ and at most 2 mm$^2$. The four semiconductor chips can thus each have a basic area in their main plane of extent which is at least 0.5 mm$^2$ and at most 2 mm$^2$.

The four semiconductor chips can be surface-mountable. Furthermore, the four semiconductor chips can be electrically contacted by bond wires at their side facing away from the carrier. In order to protect the semiconductor chips and optionally the bond wires, a covering plate can additionally be fitted at the side of the semiconductor chips facing away from the carrier. The covering plate can be transparent to the electromagnetic radiation emitted by the semiconductor chips.

It is furthermore possible for a multiplicity of first semiconductor chips, a multiplicity of second semiconductor chips, a multiplicity of third semiconductor chips and a multiplicity of fourth semiconductor chips to be arranged on the carrier. The illuminance of the optoelectronic component can thus be increased. By way of example, the total luminous flux of the semiconductor chips can be at least 1400 lumens.

In accordance with at least one embodiment, the first semiconductor chip is designed to emit electromagnetic radiation having a dominant wavelength of at least 610 nm and at most 650 nm during operation. In a non-limiting embodiment, the first semiconductor chip is designed to emit electromagnetic radiation having a dominant wavelength of 625 nm during operation. In the CIE color space, the dominant wavelength of electromagnetic radiation lies on a straight line having the color locus of the respective electromagnetic radiation and the white point. The dominant wavelength is thus the spectral wavelength which approximately corresponds to the color of the respective electromagnetic radiation. The spectrum of the electromagnetic radiation emitted by the first semiconductor chip during operation can have at least one peak. The first semiconductor chip can thus be designed to emit red light during operation. In particular, the first semiconductor chip is free of a conversion layer or a conversion element. That is to say that the electromagnetic radiation emitted by the first semiconductor chip during operation is not converted in the first semiconductor chip.

In accordance with at least one embodiment, the second semiconductor chip is designed to emit electromagnetic radiation having a dominant wavelength of at least 450 nm and at most 475 nm during operation. The second semiconductor chip can thus be designed to emit blue light during operation. In particular, the second semiconductor chip is free of a conversion layer or a conversion element. That is to say that the electromagnetic radiation emitted by the second semiconductor chip during operation is not converted in the second semiconductor chip.

In accordance with at least one embodiment, the third semiconductor chip is designed to emit electromagnetic radiation having color space coordinates of 0.3231±0.005 and 0.5408±0.005 in the CIE color space during operation. The color space coordinates can be specified for example in the CIE 10° color space or in the CIE 2° color space. In this case, the color space coordinates specify the color locus of the emitted electromagnetic radiation in the respective color space. The third semiconductor chip can thus be designed to emit green light during operation.

In accordance with at least one embodiment, the fourth semiconductor chip is designed to emit electromagnetic radiation having color space coordinates of 0.5638±0.005 and 0.4113±0.005 in the CIE color space during operation. The fourth semiconductor chip can thus be designed to emit orange-yellow (also: "amber-colored") light during operation.

In accordance with at least one embodiment, the optoelectronic component includes a first semiconductor chip, a second semiconductor chip, a third semiconductor chip and a fourth semiconductor chip, wherein the four semiconductor chips are arranged on a carrier. In this case, the first semiconductor chip is designed to emit electromagnetic radiation having a dominant wavelength of at least 610 nm and at most 650 nm during operation. The second semiconductor chip is designed to emit electromagnetic radiation having a dominant wavelength of at least 450 nm and at most 475 nm during operation. The third semiconductor chip is designed to emit electromagnetic radiation having color space coordinates of 0.3231±0.005 and 0.5408±0.005 in the CIE color space during operation. The fourth semiconductor chip is designed to emit electromagnetic radiation having color space coordinates of 0.5638±0.005 and 0.4113±0.005 in the CIE color space during operation.

The electromagnetic radiation emitted by the semiconductor chips can produce a white mixed light overall. Since the semiconductor chips can emit overall light in the entire visible range of the electromagnetic spectrum, the color rendering index of the white mixed light can be very high. A high color rendering index is advantageous for many applications, for example in the lighting of theater stages, film studios and for lighting effects. Moreover, the optoelectronic component is designed to emit white mixed light having a high luminous flux of at least 1400 lumens. The illuminance per area is thus very high and the optoelectronic component can be operated efficiently.

In accordance with at least one embodiment, the third semiconductor chip and/or the fourth semiconductor chip have/has an active region designed to emit electromagnetic radiation having a dominant wavelength of at least 430 nm and at most 490 nm during operation of the optoelectronic component. In a non-limiting embodiment, the active region is designed to emit electromagnetic radiation having a dominant wavelength of at least 440 nm and at most 450 nm during operation of the optoelectronic component. The third semiconductor chip and/or the fourth semiconductor chip thus have/has an active region designed to emit blue light during operation. Furthermore, the third and/or the fourth semiconductor chip can have electrical contacts. In this case, the intensity of the electromagnetic radiation emitted by the semiconductor chip during operation can be dependent on a voltage applied to the electrical contacts. The intensity of the electromagnetic radiation emitted by the semiconductor chip during operation can thus be controlled.

In accordance with at least one embodiment, the first semiconductor chip has an active region designed to emit electromagnetic radiation having a dominant wavelength of at least 610 nm and at most 650 nm during operation of the optoelectronic component. Advantageously, it is not necessary to convert the electromagnetic radiation emitted by the active region of the first semiconductor chip during operation in order that the first semiconductor chip is designed to emit electromagnetic radiation having a dominant wavelength of at least 610 nm and at most 650 nm during operation.

In accordance with at least one embodiment, the second semiconductor chip has an active region designed to emit electromagnetic radiation having a dominant wavelength of at least 450 nm and at most 475 nm during operation of the optoelectronic component. Advantageously, it is not necessary to convert the electromagnetic radiation emitted by the active region of the second semiconductor chip during operation in order that the second semiconductor chip is designed to emit electromagnetic radiation having a dominant wavelength of at least 450 nm and at most 475 nm during operation.

In accordance with at least one embodiment, the third semiconductor chip and/or the fourth semiconductor chip have/has a conversion element, in particular a conversion layer, designed to convert a wavelength of the electromagnetic radiation emitted by the active region. The conversion layer can be arranged at the side of the semiconductor chip facing away from the carrier. The conversion layer may include a matrix material, into which phosphor particles are introduced. The matrix material can be transparent or partly transparent to the electromagnetic radiation emitted by the semiconductor chips during operation. The conversion layer of the third semiconductor chip can have a thickness of at least 100 μm and at most 200 μm in the vertical direction, wherein the vertical direction is perpendicular to the main plane of extent of the carrier. The conversion layer of the fourth semiconductor chip can have a thickness of at least 80 μm and at most 150 μm in the vertical direction.

It is possible, moreover, for the conversion layer to be designed to convert a range of wavelengths of the electromagnetic radiation emitted by the active region. The color of the light emitted by the active region can therefore be different than the color of the light emitted by the semiconductor chip. In this case, the electromagnetic radiation emitted by the semiconductor chip may exclusively include converted radiation or be a mixture of converted radiation and unconverted radiation. Advantageously, the color of the light emitted by an active region can be changed by means of the conversion layer.

In accordance with at least one embodiment, the four semiconductor chips are arranged in two rows and two columns on the carrier. That is to say that the four semiconductor chips are arranged in two rows and two columns on the carrier in a plane that is parallel to the main plane of extent of the carrier. If the four semiconductor chips each have a square basic area, then the four semiconductor chips can be arranged in a square. As a result of the arrangement of the four semiconductor chips in two rows and two columns, these can be arranged particularly compactly on the carrier.

In accordance with at least one embodiment, the electromagnetic radiation emitted by the semiconductor chips during operation produces a white mixed light. The four semiconductor chips emit electromagnetic radiation of different colors during operation. The four colors of the semiconductor chips appear as a white mixed light to an observer. Consequently, the optoelectronic component is advantageously designed to generate white light. The white mixed light can have for example a luminous flux of at least 1400 lumens.

In order to generate the white mixed light, the light emitted by the individual semiconductor chips is weighted as a percentage. That is to say that the semiconductor chips are operated in such a way that the electromagnetic radiation emitted by the semiconductor chips constitutes a predefined percentage of the intensity of the white mixed light. The percentage proportions of the electromagnetic radiation emitted by the semiconductor chips can be changed in accordance with various criteria. By way of example, the color temperature and the color rendering index of the white mixed light can be changed by changing the percentage proportions of the electromagnetic radiation emitted by the semiconductor chips. The intensity of the electromagnetic radiation emitted by a semiconductor chip can be changed for example by means of the forward current applied to the electrical contact. Alternatively or additionally, it is possible for the driving to be effected by means of pulse width modulation.

If the optoelectronic component includes a multiplicity of different semiconductor chips, then the number of respective semiconductor chips can be adapted to the percentage proportion of the respective emitted radiation. By way of example, generating white mixed light requires as a percentage less blue light than green light. Therefore, the optoelectronic component may include fewer second semiconductor chips than third semiconductor chips. By adapting the number of respective semiconductor chips to the required white mixed light, the optoelectronic component can be operated efficiently.

In accordance with at least one embodiment, the color temperature of the white mixed light is adjustable, wherein a color rendering index of the white mixed light is at least 90 for each adjustable color temperature. The color temperature of the white mixed light can be adjusted by changing the intensity of the electromagnetic radiation emitted by the four semiconductor chips. By way of example, it is possible to calculate what percentage proportions of the intensity of the white mixed light are required by the light of the four semiconductor chips. The color temperature can be changed continuously in this way. At the same time, the spectra of the four types of semiconductor chips enable the color rendering index of the white mixed light to be at least 90 in every case. That is to say that the spectra of the semiconductor chips or the dominant wavelength and the color space coordinates are chosen in such a way that at the same time the color temperature of the white mixed light is adjustable and the color rendering index of the white mixed light is at least 90.

Such a white mixed light is particularly suitable for applications in which human beings are illuminated, such as, for example, on theater stages or in film studios.

At the same time, the high brightness of the four semiconductor chips and the compact arrangement of the four semiconductor chips enable a compact size of the optoelectronic component.

In accordance with at least one embodiment, the color temperature of the white mixed light is adjustable between 3000 K and 7000 K. The color temperature of the white mixed light is thus adjustable in a large color temperature range. In particular, the color temperature of the white mixed light can be continuously adjustable or tunable.

In accordance with at least one embodiment, the color rendering index Ra of the white mixed light is at least 95. That is to say that the color rendering index Ra of the white mixed light is at least 95 for each of the adjustable color temperatures. It is furthermore possible for the color rendering index Ra of the white mixed light to be at least 97 for some color temperatures. By illuminating an object with light having a high color rendering index Ra, it is possible for all colors of the object to be perceived by an observer. A high color rendering index Ra is advantageous in particular for the illumination of human beings.

In accordance with at least one embodiment, the color rendering index R9 of the white mixed light is at least 93. That is to say that the color rendering index R9 of the white mixed light is at least 93 for each of the adjustable color temperatures. It is furthermore possible for the color rendering index R9 of the white mixed light to be at least 95 for some color temperatures. The color rendering index R9 specifies how well red hues are rendered. A high color rendering index R9 is also advantageous in particular for the illumination of human beings.

In accordance with at least one embodiment, the first semiconductor chip is designed to emit electromagnetic radiation having a dominant wavelength of at least 620 nm and at most 640 nm during operation. It has been found that the color rendering index of the white mixed light for various color temperatures can be particularly high for this wavelength range.

In accordance with at least one embodiment, the second semiconductor chip is designed to emit electromagnetic radiation having a dominant wavelength of at least 460 nm and at most 465 nm during operation. It has been found that the color rendering index of the white mixed light for various color temperatures can be particularly high for this wavelength range.

BRIEF DESCRIPTION OF THE DRAWINGS

The optoelectronic component described here is explained in greater detail below in association with associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or to afford a better understanding.

DETAILED DESCRIPTION

Figure 1:
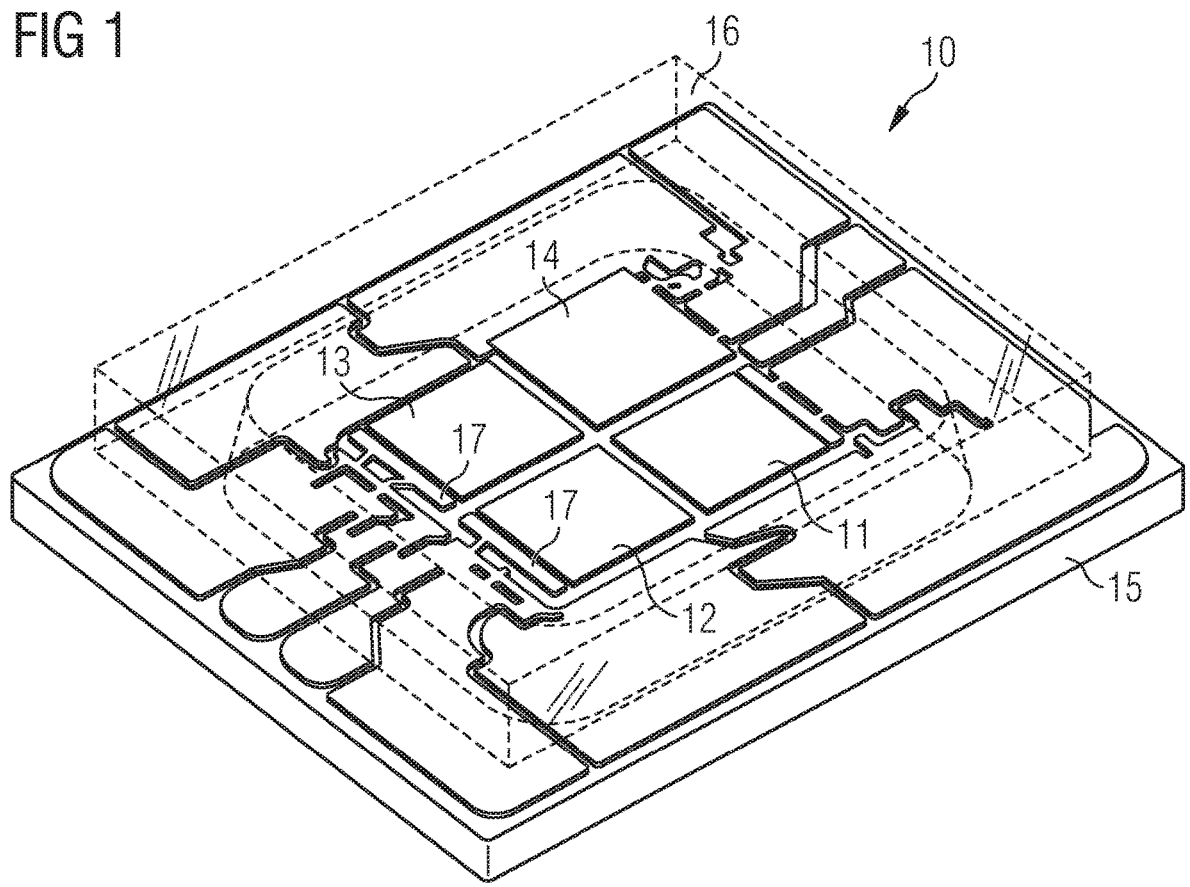
FIG. 1 shows one embodiment of the optoelectronic component.

FIG. 1 shows one embodiment of the optoelectronic component 10. A first semiconductor chip 11, a second semiconductor chip 12, a third semiconductor chip 13 and a fourth semiconductor chip 14 are arranged on a carrier 15. The four semiconductor chips, 11, 12, 13, 14 are for example light emitting diodes designed to emit electromagnetic radiation during operation of the optoelectronic component 10. The four semiconductor chips 11, 12, 13, 14 have electrical contacts 17. The electrical contacts 17 can be connected for example to an electrical contact of the carrier 15 by way of bond wires. A covering plate 16 is arranged at the side of the four semiconductor chips 11, 12, 13, 14 facing away from the carrier 15. The covering plate 16 completely covers the four semiconductor chips 11, 12, 13, 14 and is at least partly transparent to the electromagnetic radiation emitted by the semiconductor chips 11, 12, 13, 14.

The first semiconductor chip 11 is designed to emit electromagnetic radiation having a dominant wavelength of 625 nm during operation. The second semiconductor chip 12 is designed to emit electromagnetic radiation having a dominant wavelength of 465 nm during operation. The third semiconductor chip 13 is designed to emit electromagnetic radiation having color space coordinates in the CIE color space of x=0.3231 and y=0.5408 during operation. The fourth semiconductor chip 14 is designed to emit electromagnetic radiation having color space coordinates in the CIE color space of x=0.5638 and y=0.4113 during operation. The light emitted by the four semiconductor chips 11, 12, 13, 14 during operation thus produces a white mixed light.

The four semiconductor chips 11, 12, 13, 14 are arranged in two rows and two columns on the carrier 15. Furthermore, the four semiconductor chips 11, 12, 13, 14 each have a square basic area, such that the four semiconductor chips 11, 12, 13, 14 are arranged compactly on the carrier 15.

Figure 2:
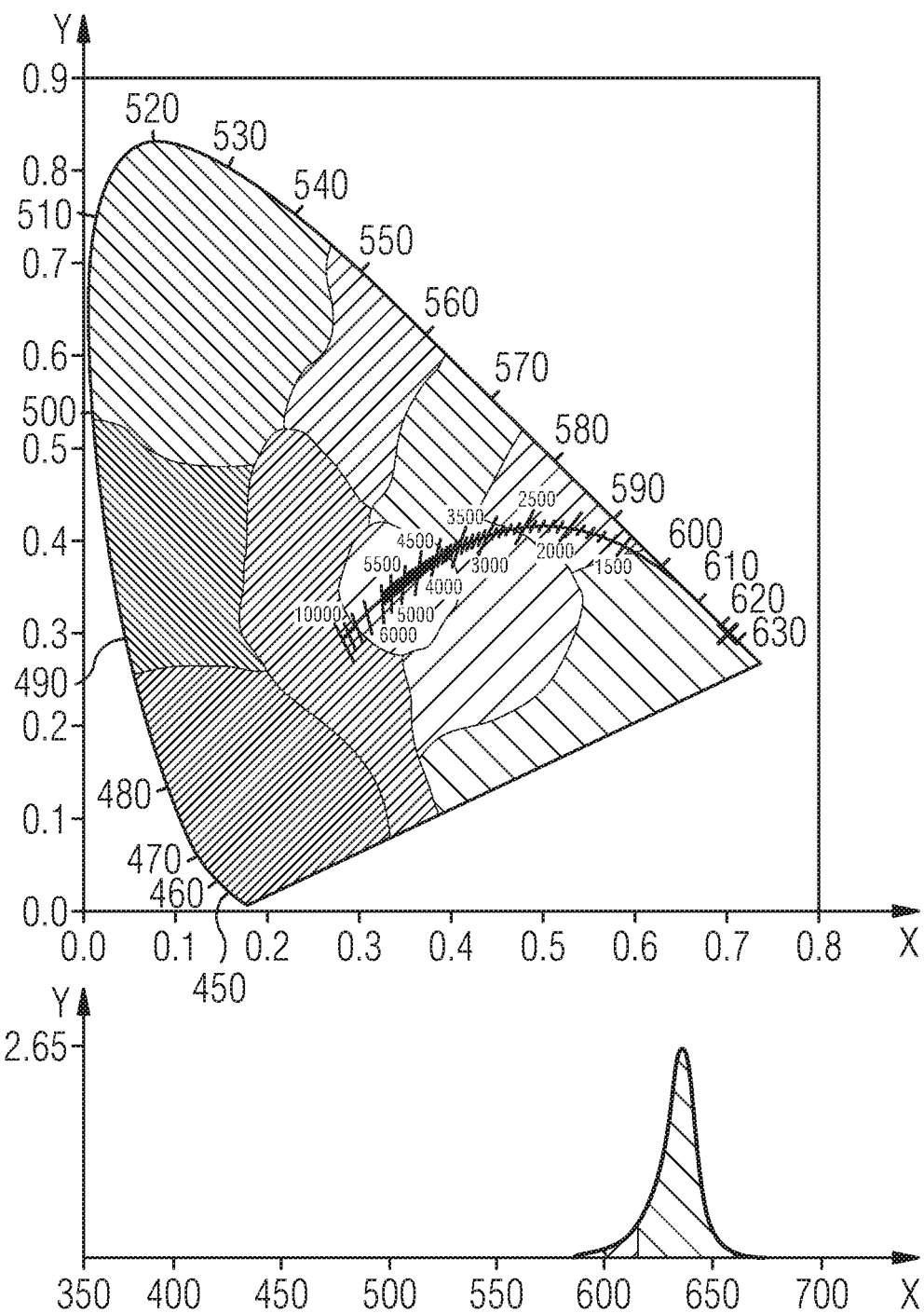
FIGS. 2, 3, 4 and 5 show by way of example the color space coordinates and spectra of the four semiconductor chips.

FIG. 2 illustrates in the upper diagram the color space coordinates of the light emitted by one embodiment of the first semiconductor chip 11 in the CIE color space. Moreover, the spectrum of the emitted light is illustrated in the lower diagram in FIG. 2. In the upper diagram, the color space coordinates in the CIE color space are plotted on the x-axis and the y-axis. Furthermore, the color space coordinates of white mixed light of various color temperatures in kelvins are illustrated on a curve. Moreover, the color locus of the light emitted by the first semiconductor chip 11 in the CIE color space is marked by an x. In the lower diagram, the wavelength in nanometers is plotted on the x-axis and the intensity in arbitrary units of the light emitted by the first semiconductor chip 11 is plotted on the y-axis. The dominant wavelength of the light emitted by the first semiconductor chip 11 is 625 nm. The first semiconductor chip 11 is thus designed to emit red light during operation.

Figure 3:
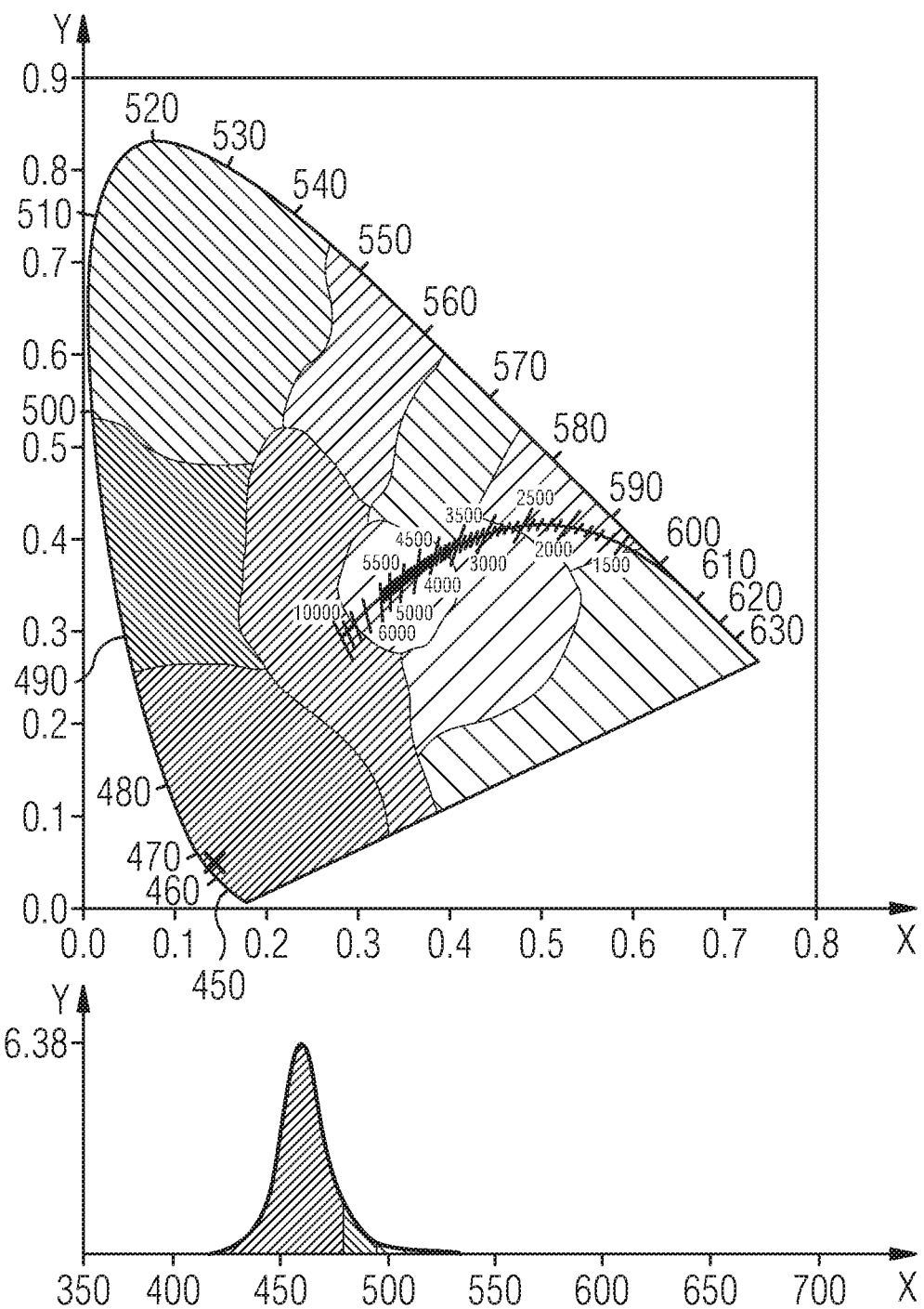

FIG. 3 illustrates in the upper diagram the color space coordinates of the light emitted by one embodiment of the second semiconductor chip 12 in the CIE color space. Moreover, the spectrum of the emitted light is illustrated in the lower diagram in FIG. 3. In the upper diagram, the color space coordinates in the CIE color space are plotted on the x-axis and the y-axis. As in FIG. 2, the color space coordinates of white mixed light of various color temperatures in kelvins are illustrated on a curve. Moreover, the color locus of the light emitted by the second semiconductor chip 12 in the CIE color space is marked by an x. In the lower diagram, the wavelength in nanometers is plotted on the x-axis and the intensity in arbitrary units of the light emitted by the second semiconductor chip 12 is plotted on the y-axis. The dominant wavelength of the light emitted by the second semiconductor chip 12 is 465 nm. The second semiconductor chip 12 is thus designed to emit blue light during operation.

Figure 4:
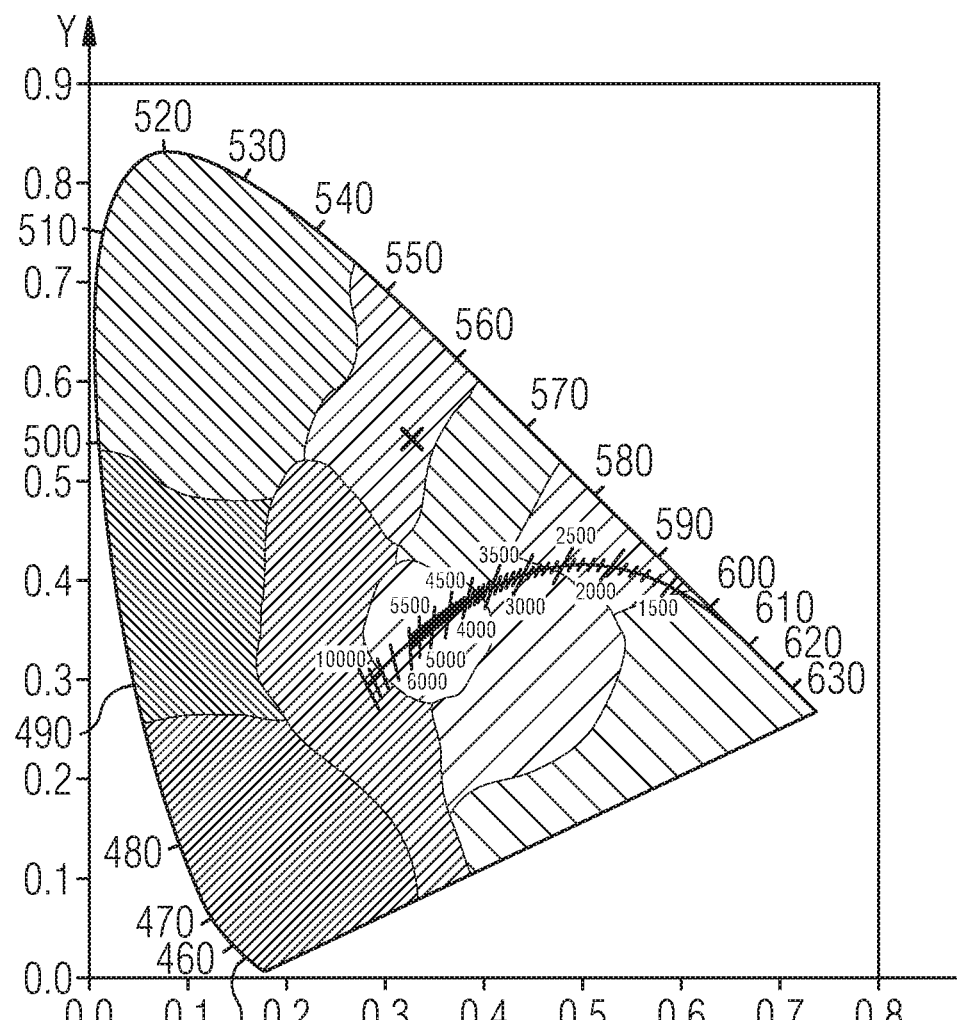
Figure 4:
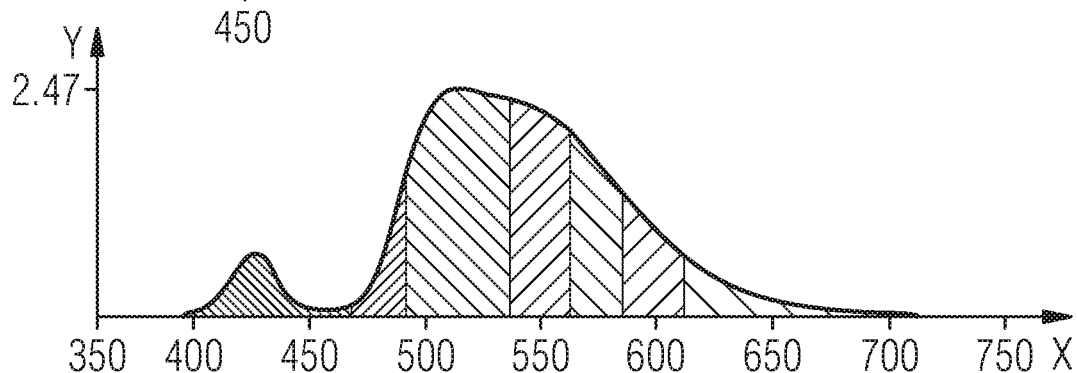

FIG. 4 illustrates in the upper diagram the color space coordinates of the light emitted by one embodiment of the third semiconductor chip 13 in the CIE color space. Moreover, the spectrum of the emitted light is illustrated in the lower diagram in FIG. 4. As in FIGS. 2 and 3, the color space coordinates in the CIE color space are plotted in the upper diagram. Moreover, the color locus of the light emitted by the third semiconductor chip 13 having the color space coordinates x=0.3231 and y=0.5408 in the CIE color space is marked by an x. The emitted light is not one spectral color, but rather a mixed light having a wide spectrum, as illustrated in the lower diagram. In the lower diagram, the wavelength in nanometers is plotted on the x-axis and the intensity in arbitrary units of the light emitted by the third semiconductor chip 13 is plotted on the y-axis. The third semiconductor chip 13 is thus designed to emit green light during operation.

Figure 5:
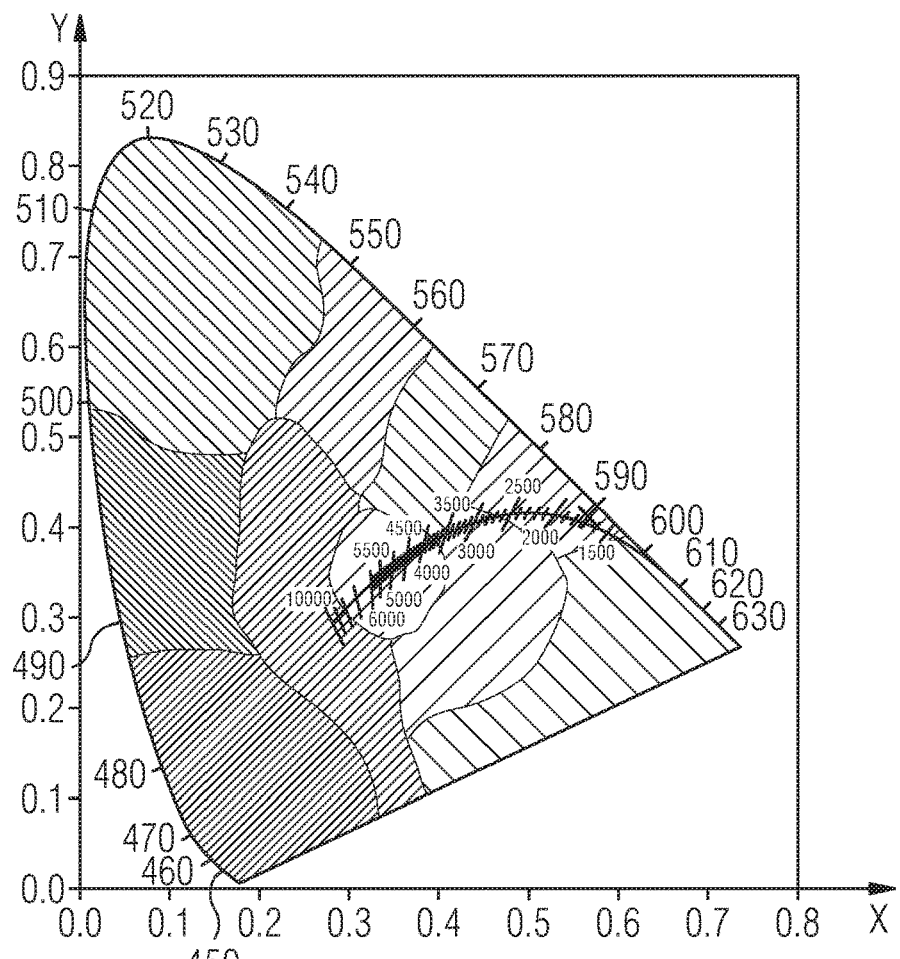

FIG. 5 illustrates in the upper diagram the color space coordinates of the light emitted by one embodiment of the fourth semiconductor chip 14 in the CIE color space. Moreover, the spectrum of the emitted light is illustrated in the lower diagram in FIG. 5. As in FIGS. 2 to 4, the color space coordinates in the CIE color space are plotted in the upper diagram. Moreover, the color locus of the light emitted by the fourth semiconductor chip 14 having the color space coordinates x=0.5638 and y=0.4113 in the CIE color space is marked by an x. The emitted light is not one spectral color, but rather a mixed light having a wide spectrum, as illustrated in the lower diagram. In the lower diagram, the wavelength in nanometers is plotted on the x-axis and the intensity in arbitrary units of the light emitted by the fourth semiconductor chip 14 is plotted on the y-axis. The fourth semiconductor chip 14 is thus designed to emit orange-yellow light during operation.

Figure 6:
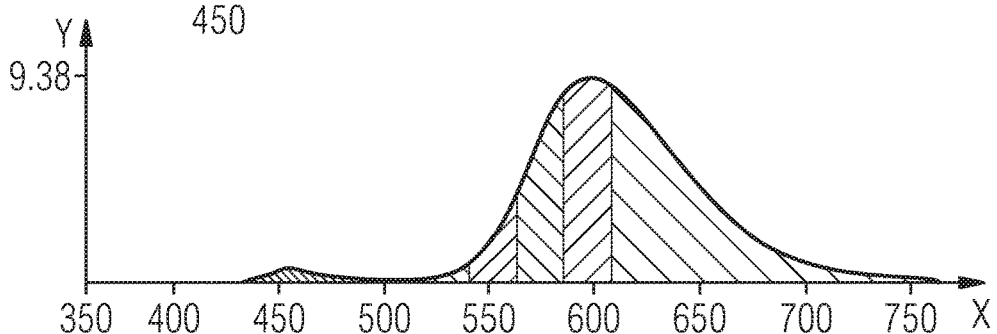
FIG. 6 indicates the composition of the white mixed light at various color temperatures.

FIG. 6 indicates the composition of the white mixed light by way of example for various color temperatures between 3000 K and 7000 K. The light emitted by the four semiconductor chips 11, 12, 13, 14 during operation appears as white mixed light to an observer. To that end, the light emitted by the four semiconductor chips 11, 12, 13, 14 contributes in each case a different proportion to the white mixed light. That is to say that the light emitted by the four semiconductor chips 11, 12, 13, 14 has in each case a different intensity. The intensity of the light emitted by the four semiconductor chips 11, 12, 13, 14 can be changed by means of the energization of the four semiconductor chips 11, 12, 13, 14. By way of example, the light emitted by the first semiconductor chip 11 for generating a color temperature of 3000 K constitutes 12.1% of the intensity of the white mixed light. The light emitted by the second semiconductor chip 12 constitutes a proportion of 55.6% for the same color temperature. Moreover, for the same color temperature, the light emitted by the third semiconductor chip 13 constitutes a proportion of 1.4% and the light emitted by the fourth semiconductor chip 14 constitutes a proportion of 30.9%.

For generating a different color temperature of the white mixed light, for example of 4000 K, the proportions of the four semiconductor chips 11, 12, 13, 14 are different than the proportions for generating a color temperature of 3000 K. The color temperature of the white mixed light is thus adjustable between 3000 K and 7000 K by changing the proportions of the white mixed light that are constituted by the light generated by the four semiconductor chips 11, 12, 13, 14. FIG. 6 indicates by way of example the proportions for the color temperatures 3000 K, 4000 K, 5000 K, 6000 K and 7000 K. The proportions of the emitted light of the four semiconductor chips 11, 12, 13, 14 are normalized to 100%.

Moreover, FIG. 6 shows that the color rendering index Ra is 97 for a color temperature of 3000 K in accordance with the exemplary embodiment shown, and that the color rendering index R9 is 96 for a color temperature of 3000 K. For the range between 3000 K and 7000 kelvins, the color rendering index Ra is at least 95 and the color rendering index R9 is at least 93.

The optoelectronic component 10 described here is thus designed to generate white mixed light having a high luminous flux and a high color rendering index, wherein the color temperature of the white mixed light is adjustable.

Figure 7:
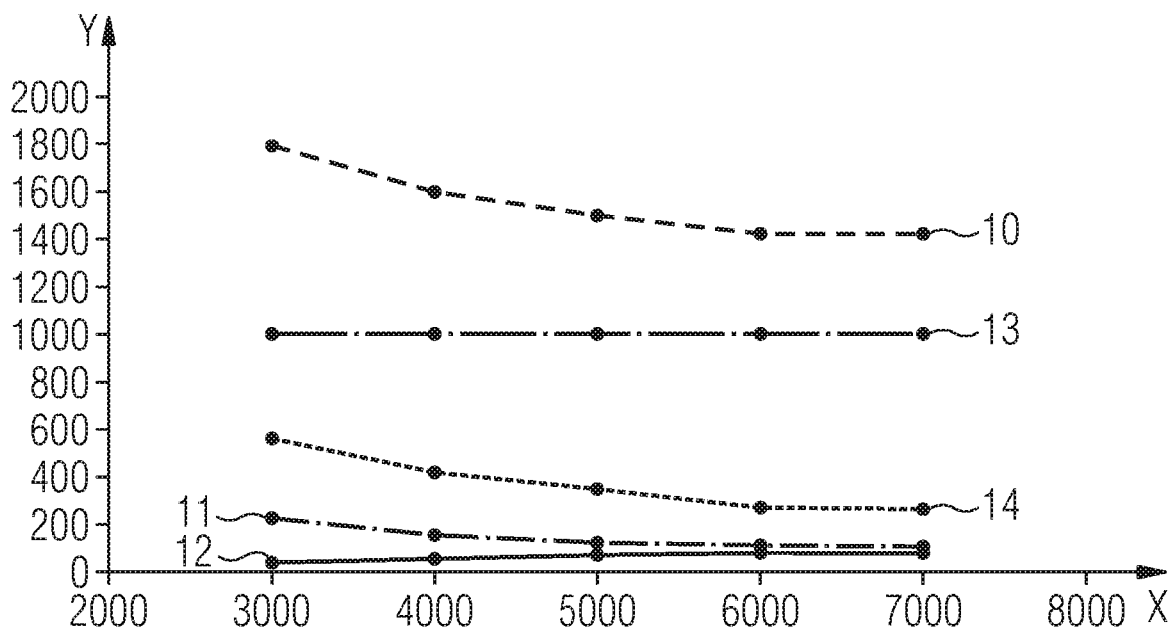
FIG. 7 indicates the luminous flux of the four semiconductor chips by way of example.

The luminous flux for various color temperatures is plotted by way of example in FIG. 7. The color temperature in kelvins is plotted on the x-axis and the luminous flux in lumens in plotted on the y-axis. The luminous flux is plotted for the light emitted by each of the four semiconductor chips 11, 12, 13, 14. Moreover, the luminous flux of the white mixed light emitted by the optoelectronic component 10 is plotted. The luminous flux of the first semiconductor chip 11, of the fourth semiconductor chip 14 and of the white mixed light emitted by the optoelectronic component 10 decreases as the color temperature rises. The luminous flux of the second semiconductor chip 12 and of the third semiconductor chip 13 is constant in the indicated range of the color temperature. Overall, the luminous flux of the white mixed light emitted by the optoelectronic component 10 in the indicated range of the color temperatures is always at least 1400 lumens.

Figure 8:
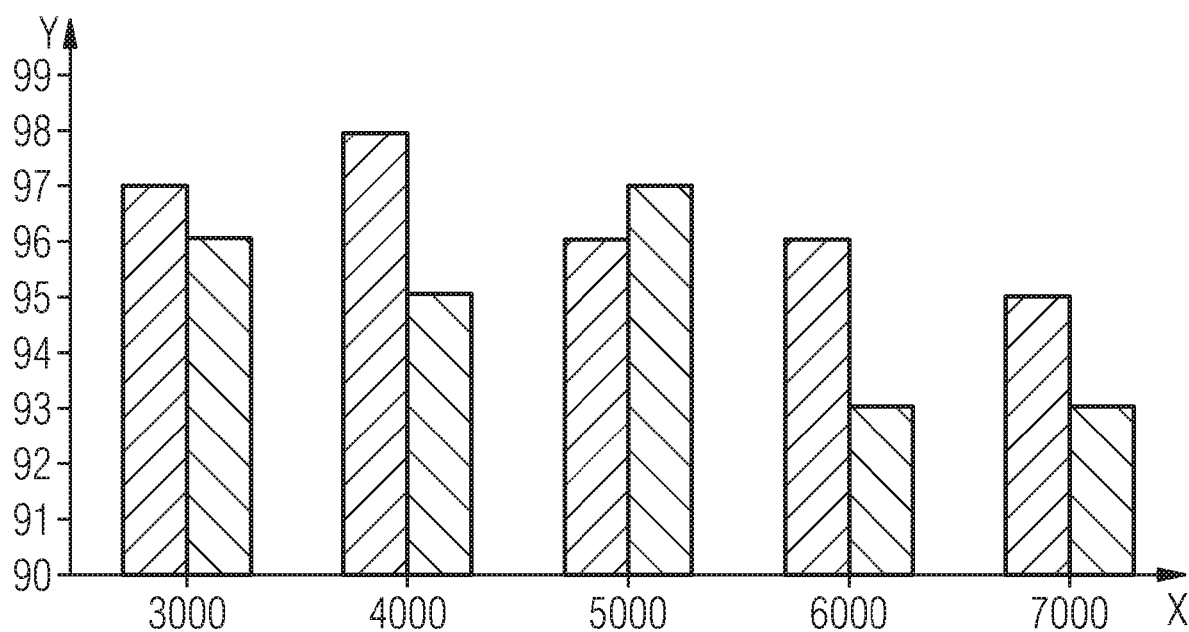
FIG. 8 shows various values of the color rendering index of one embodiment of the optoelectronic component.

FIG. 8 indicates the color rendering index for various color temperatures of the white mixed light of one exemplary embodiment of the optoelectronic component 10. The color temperature in kelvins is plotted on the x-axis and the color rendering index is plotted on the y-axis. The left-hand column for each color temperature relates to the color rendering index Ra and the right-hand column relates to the color rendering index R9. As shown in FIG. 6, the color rendering index Ra is at least 95 and the color rendering index R9 is at least 93.

Figure 9A:
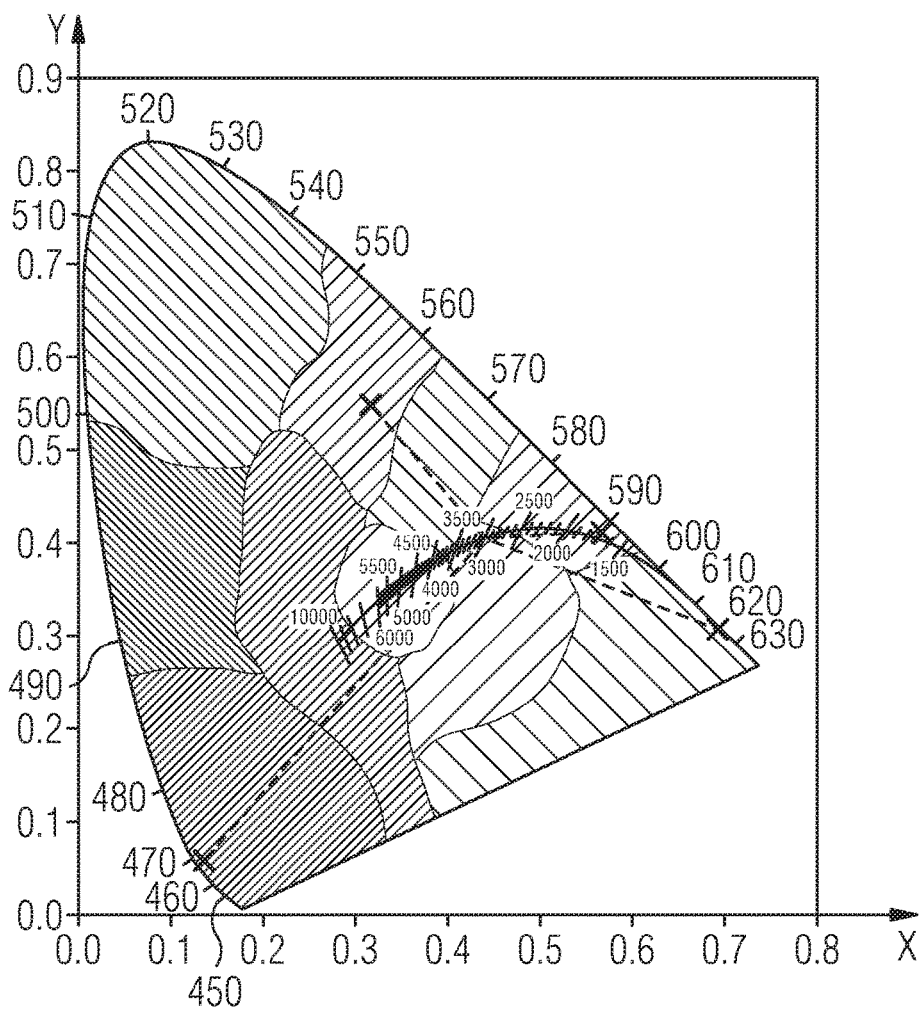
FIGS. 9A, 9B, 10A, 10B, 11A, 11B, 12A, 12B, 13A and 13B show by way of example the color space coordinates, the spectrum and various values of the color rendering index of the light emitted by the optoelectronic component for various color temperatures.
Figure 9A:
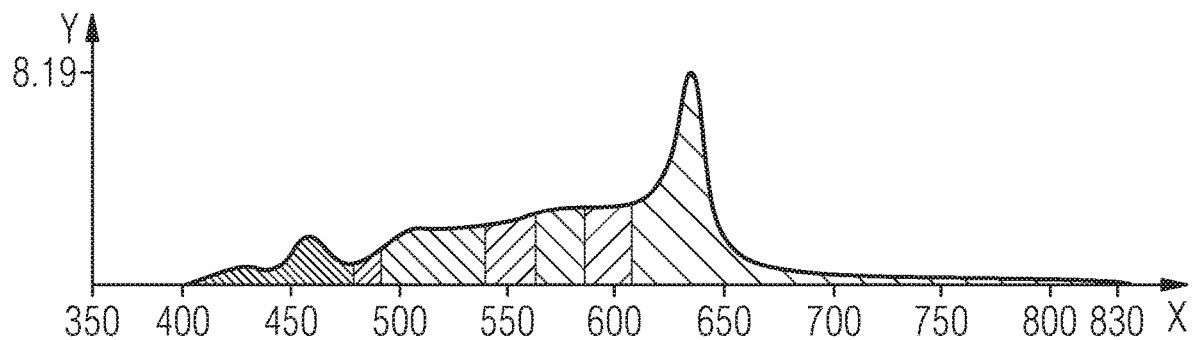

FIG. 9A shows by way of example the spectrum of the white mixed light for a color temperature of 3000 K. The four color loci of the light emitted by the four semiconductor chips 11, 12, 13, 14 in the CIE color space are plotted in the upper diagram in FIG. 9A. In the lower diagram, the wavelength in nanometers is plotted on the x-axis and the intensity in arbitrary units is plotted on the y-axis. In order to generate the shown spectrum of the white mixed light, the four semiconductor chips 11, 12, 13, 14 are driven in such a way that the light emitted by the four semiconductor chips 11, 12, 13, 14 in each case constitutes a different proportion of the white mixed light. Since the spectrum of the white mixed light extends over the entire visible range, it has a high color rendering index.

Figure 9B:
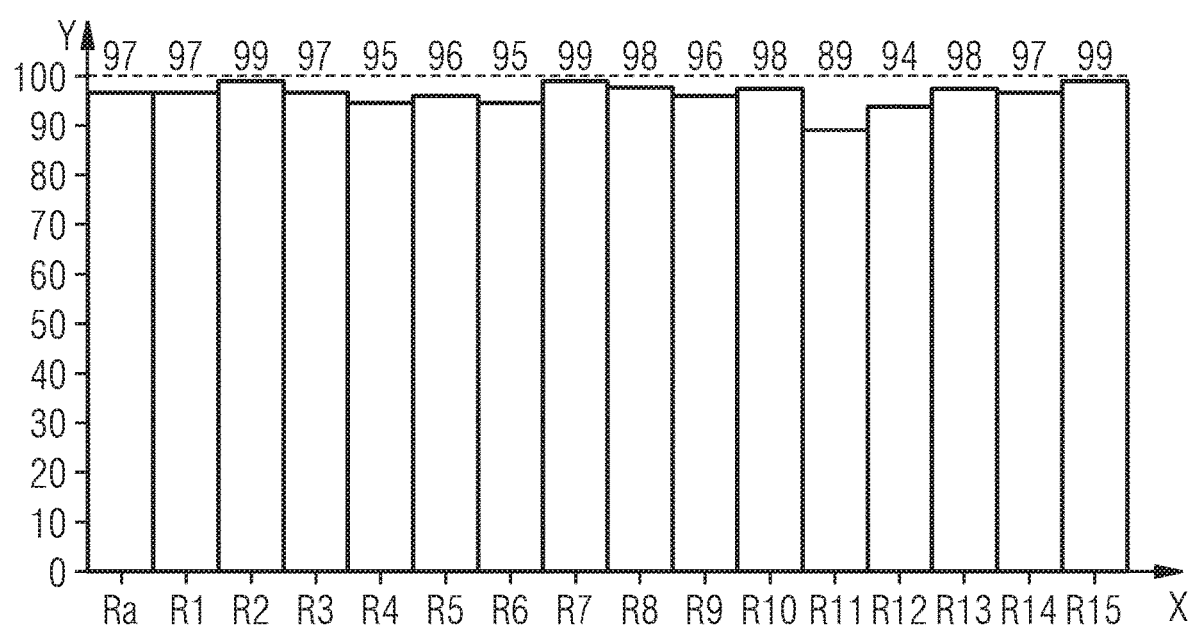

The color rendering indexes Ra and R1 to R15 for the white mixed light shown in FIG. 9A are plotted in FIG. 9B. The different color rendering indexes are plotted on the x-axis and the value of the respective color rendering index is plotted on the y-axis. Almost all of the color rendering indexes shown have a value of at least 95.

Figure 10A:
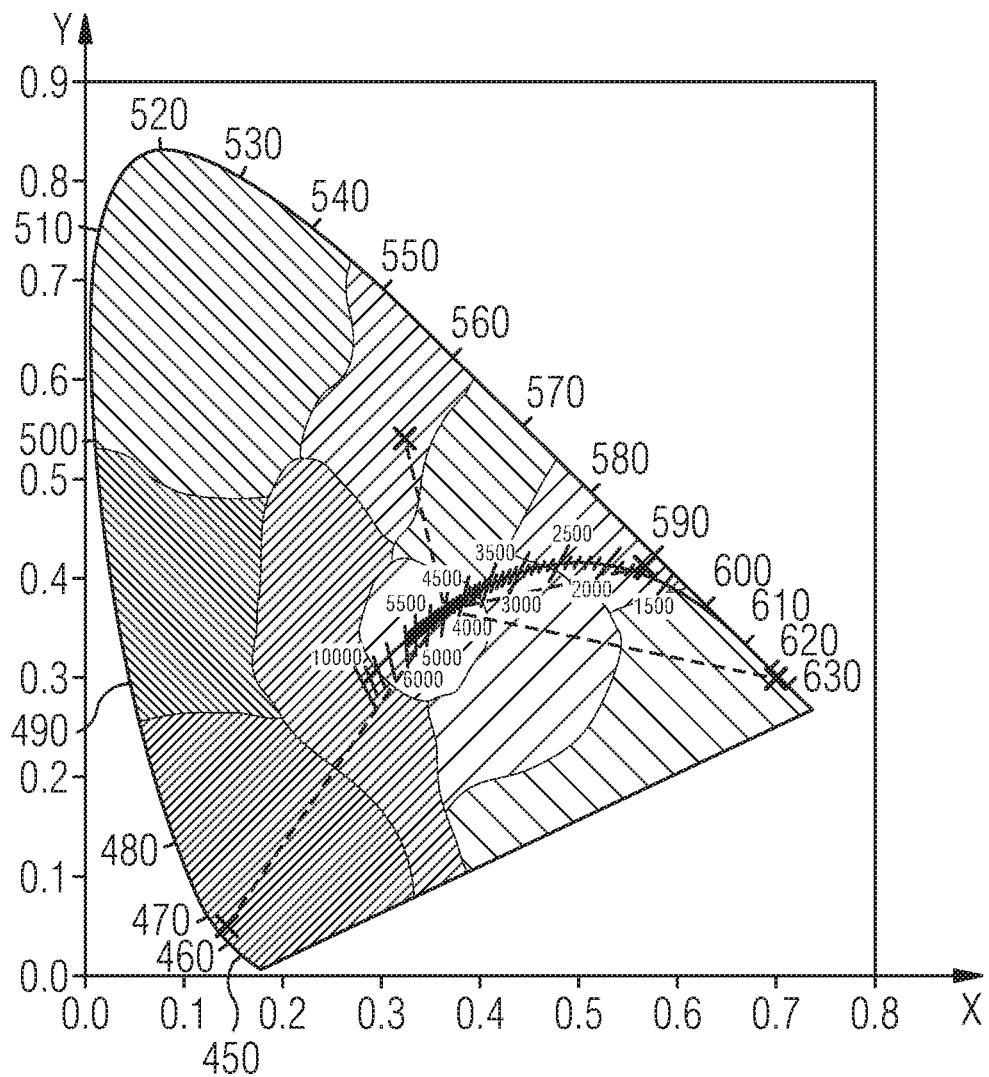
Figure 10A:
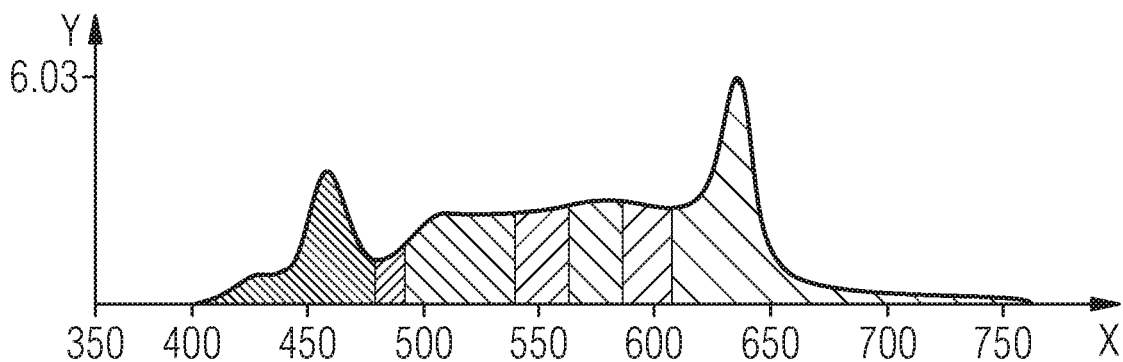

FIG. 10A shows by way of example the spectrum of the white mixed light for a color temperature of 4000 K. As in FIG. 9A, the four color loci of the light emitted by the four semiconductor chips 11, 12, 13, 14 in the CIE color space are plotted in the upper diagram. As in FIG. 9A, the spectrum of the white mixed light is plotted in the lower diagram. Since the proportions of the white mixed light that are constituted by the light emitted by the four semiconductor chips 11, 12, 13, 14 are different than the proportions in FIG. 9A, the spectrum of the white mixed light has a different shape than in FIG. 9A.

Figure 10B:
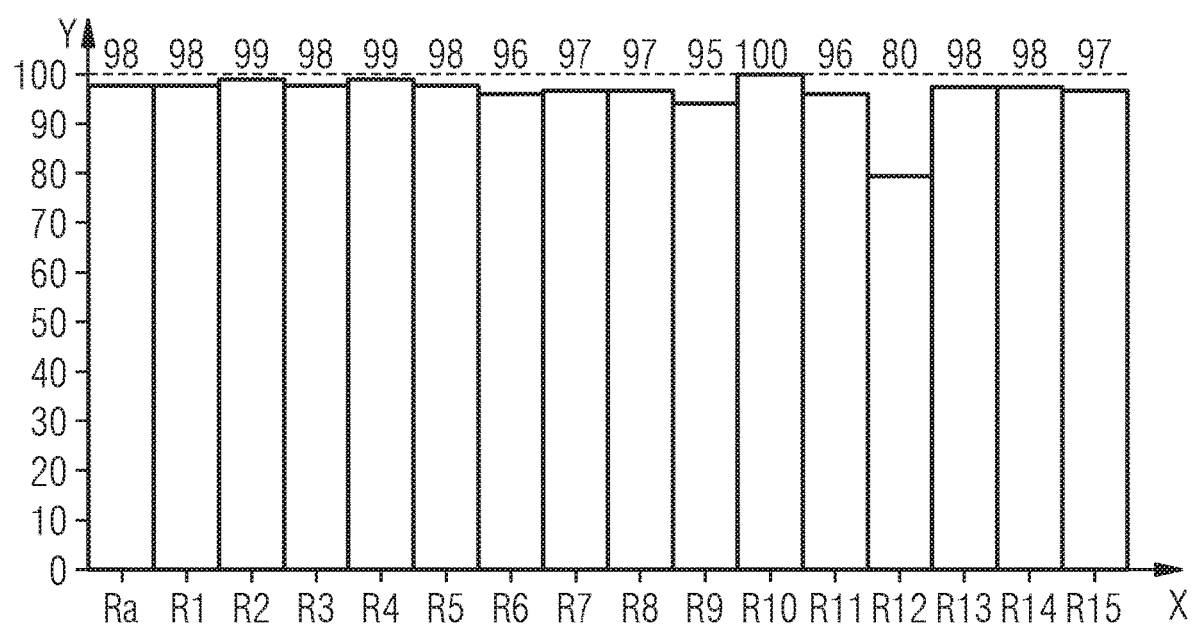

As in FIG. 9B, the color rendering indexes Ra and R1 to R15 for the white mixed light shown in FIG. 10A are plotted in FIG. 10B.

Figure 11A:
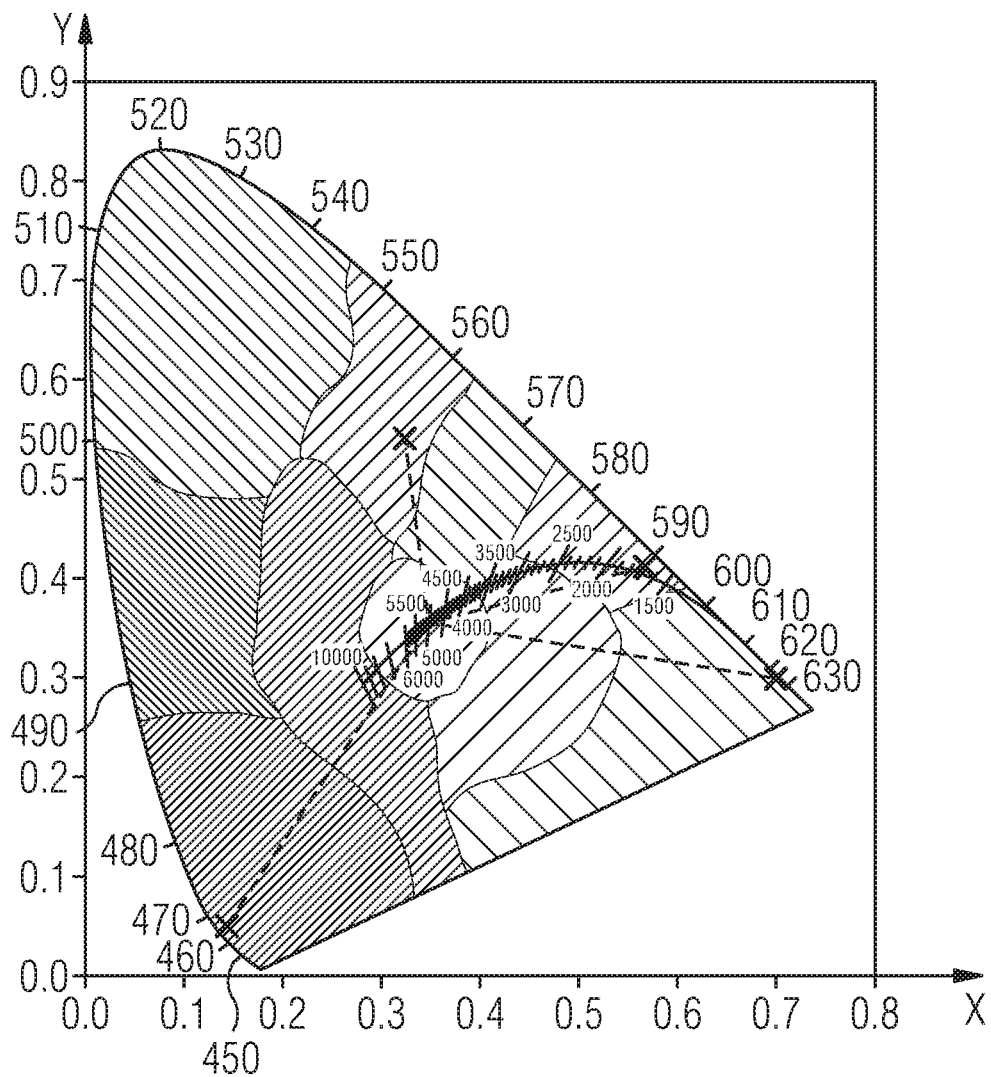
Figure 11A:
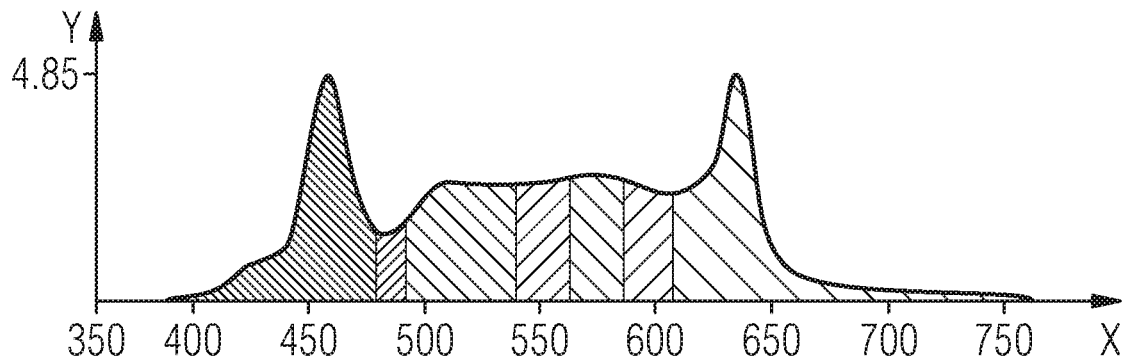

FIG. 11A shows by way of example the spectrum of the white mixed light for a color temperature of 5000 K analogously to FIGS. 9A and 10A. The colder the white of the white mixed light becomes, the greater the proportion of the white mixed light that is constituted by the light emitted by the second semiconductor chip 12.

Figure 11B:
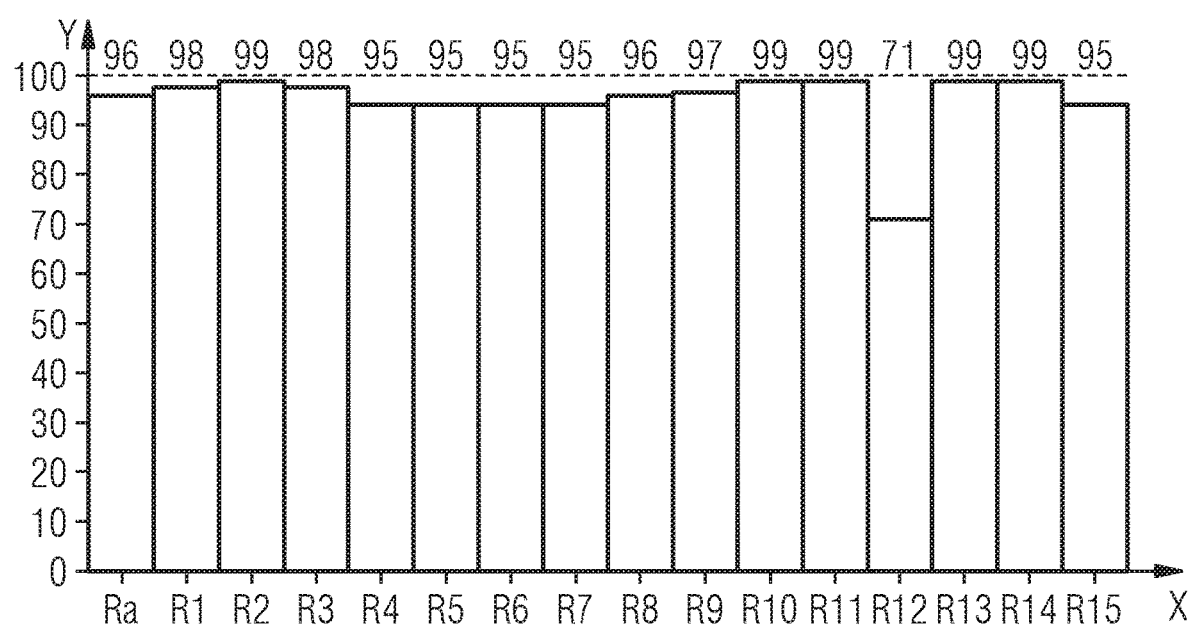

Analogously to FIGS. 9B and 10B, the color rendering indexes Ra and R1 to R15 for the white mixed light shown in FIG. 11A are plotted in FIG. 11B.

Figure 12A:
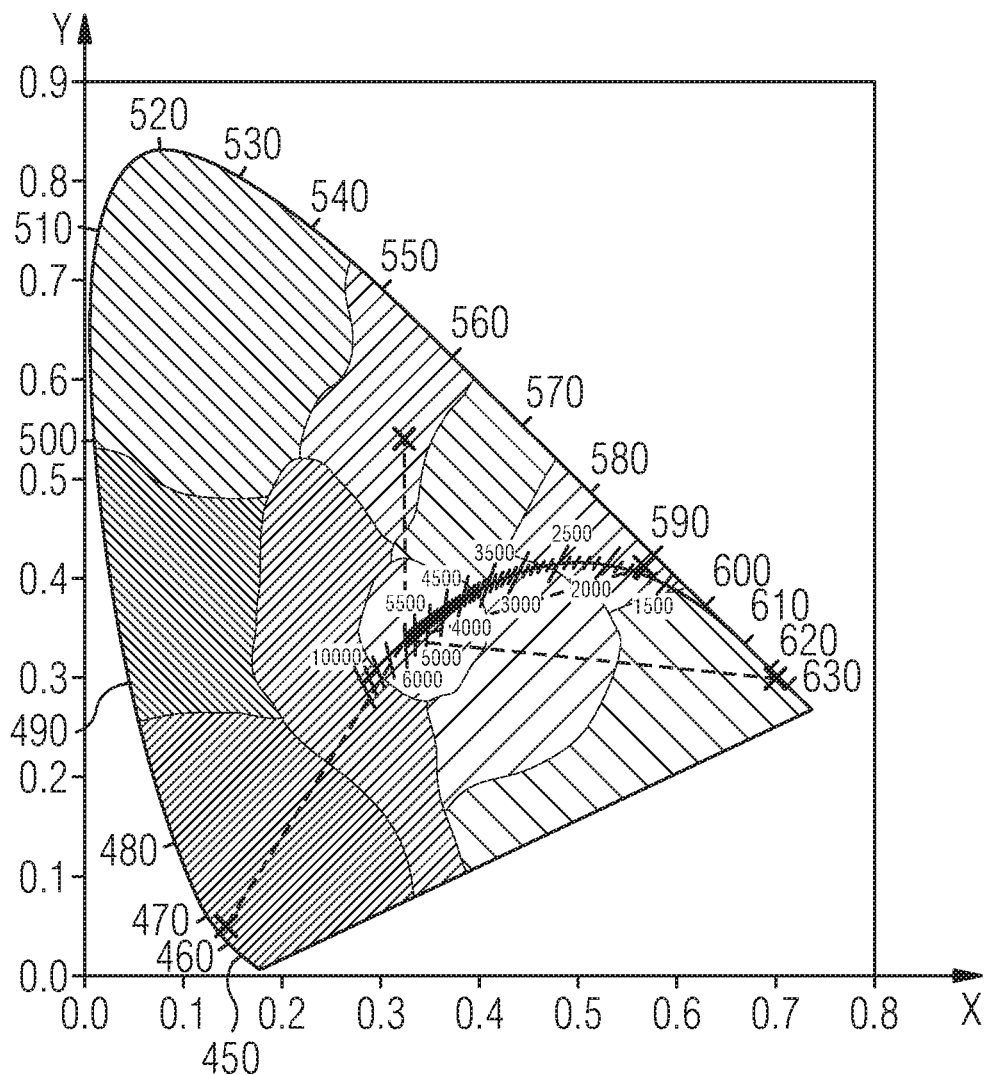
Figure 12A:
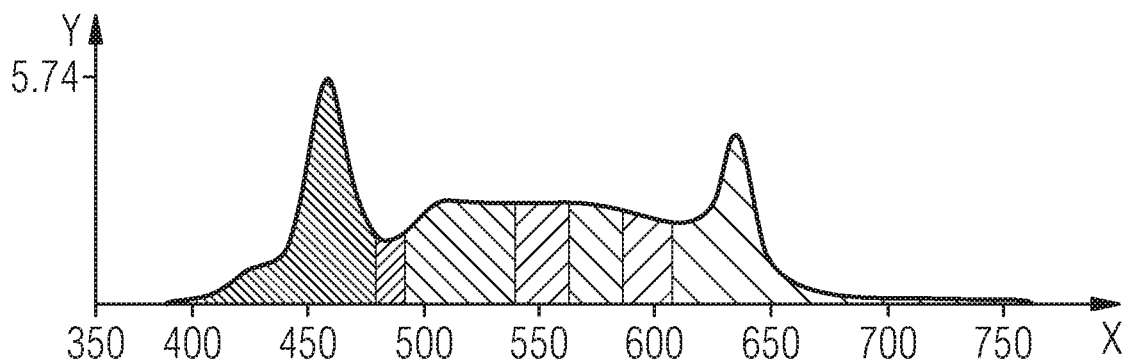

FIG. 12A shows by way of example the spectrum of the white mixed light for a color temperature of 6000 K analogously to FIGS. 9A, 10A and 11A.

Figure 12B:
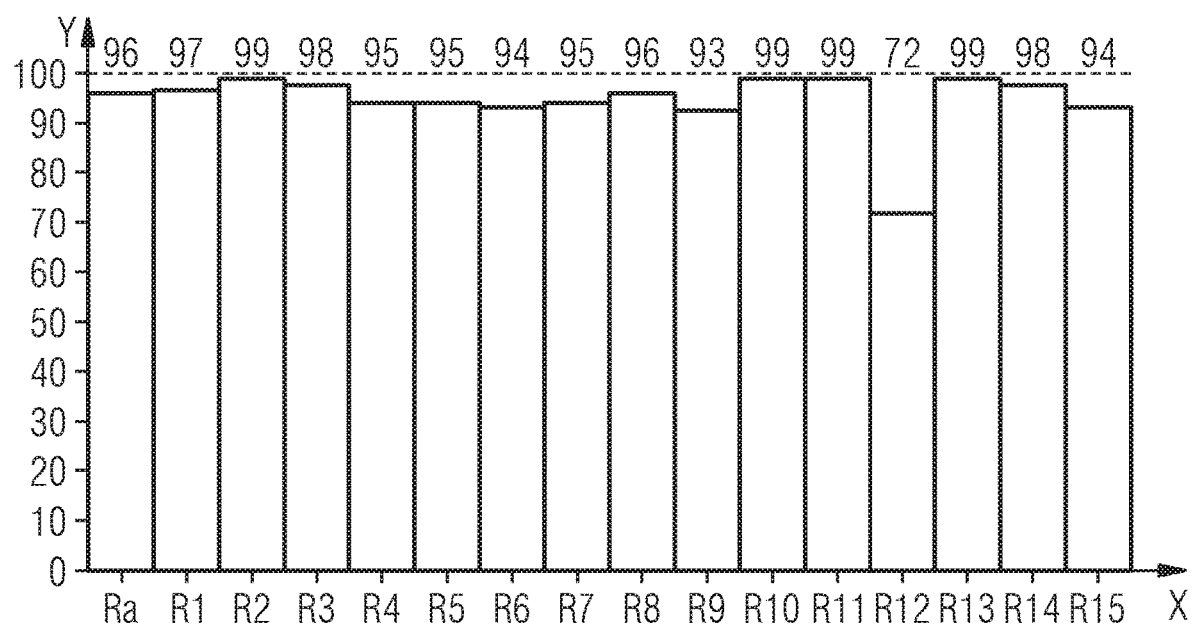

Analogously to FIGS. 9B, 10B and 11B, the color rendering indexes Ra and R1 to R15 for the white mixed light shown in FIG. 12A are plotted in FIG. 12B.

Figure 13A:
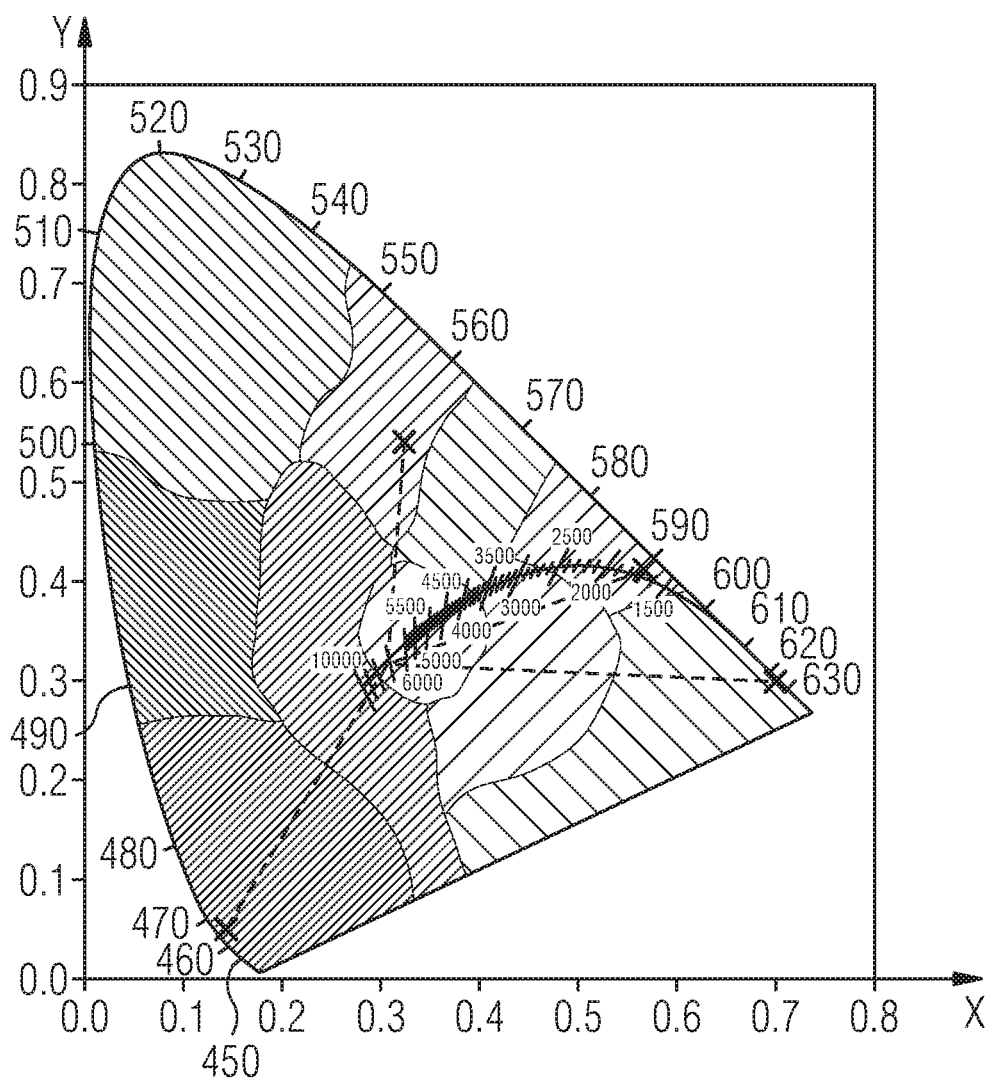
Figure 13A:
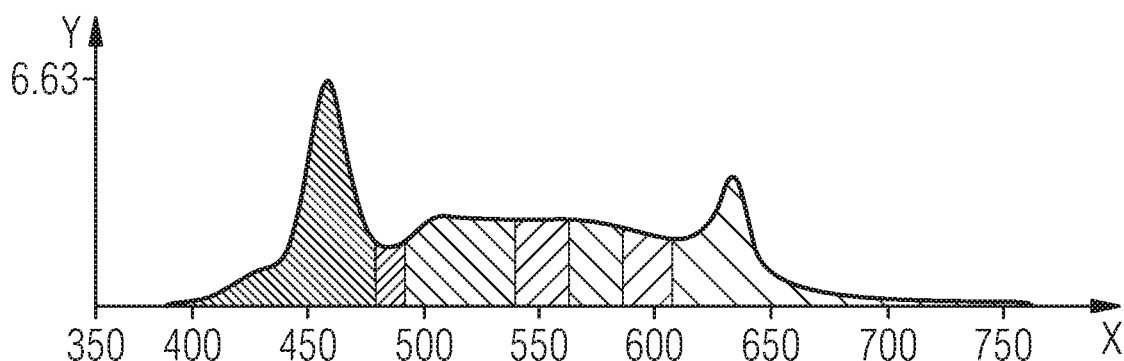

FIG. 13A shows by way of example the spectrum of the white mixed light for a color temperature of 7000 K analogously to FIGS. 9A, 10A, 11A and 12A.

Figure 13B:
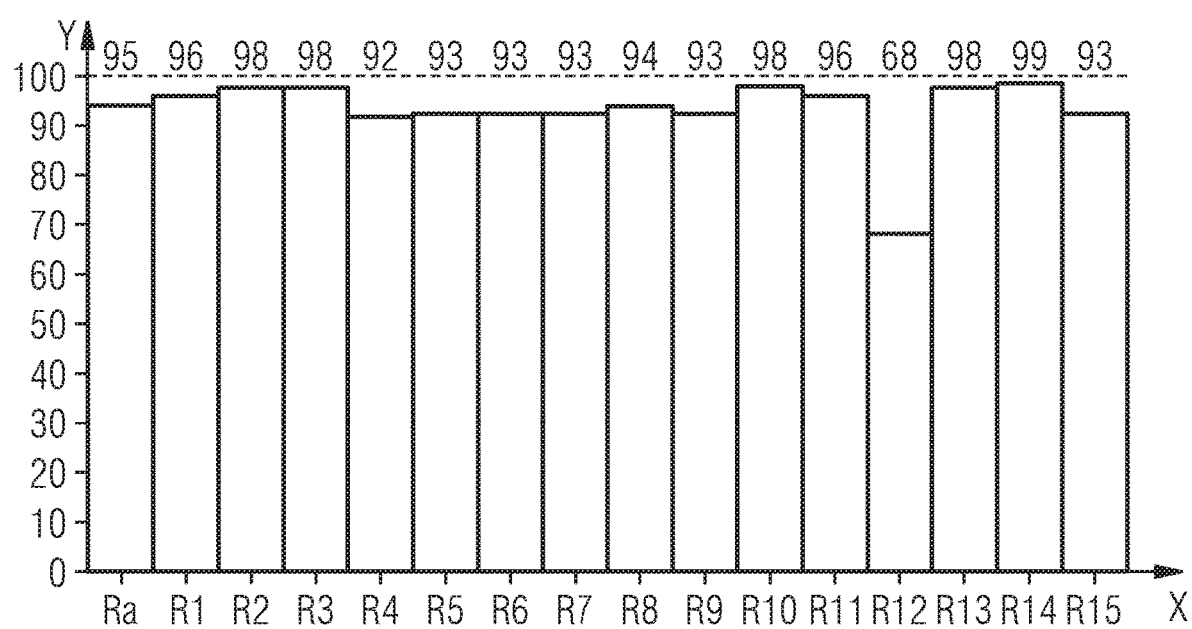

Analogously to FIGS. 9B, 10B, 11B and 12B, the color rendering indexes Ra and R1 to R15 for the white mixed light shown in FIG. 13A are plotted in FIG. 13B.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or embodiments.

The present patent application claims the priority of the German patent application DE 10 2017 122 936.1, the disclosure content of which is hereby incorporated by reference.

LIST OF REFERENCE SIGNS

10: Optoelectronic component
11: First semiconductor chip
12: Second semiconductor chip
13: Third semiconductor chip
14: Fourth semiconductor chip
15: Carrier
16: Covering plate
17: Electrical contact

The invention claimed is:

1. An optoelectronic component comprising:
a first semiconductor chip;
a second semiconductor chip;
a third semiconductor chip; and
a fourth semiconductor chip; wherein
the first semiconductor chip, the second semiconductor chip, the third semiconductor chip, and the fourth semiconductor chip are arranged on a carrier;
the first semiconductor chip is configured to emit electromagnetic radiation having a dominant wavelength ranging from about 610 nm to about 650 nm during operation; wherein the first semiconductor chip is free of a conversion element;
the first semiconductor chip comprises an active region configured to emit electromagnetic radiation having a dominant wavelength ranging from about 610 nm to about 650 nm during operation of the optoelectronic component;
the second semiconductor chip is configured to emit electromagnetic radiation having a dominant wavelength ranging from about 450 nm to about 475 nm during operation;
the third semiconductor chip is configured to emit electromagnetic radiation having color space coordinates of 0.3231±0.005 and 0.5408±0.005 in the CIE color space during operation;
the fourth semiconductor chip is configured to emit electromagnetic radiation having color space coordinates of 0.5638±0.005 and 0.4113±0.005 in the CIE color space during operation; and
the third semiconductor chip and/or the fourth semiconductor chip have a conversion layer configured to convert a wavelength of the electromagnetic radiation emitted by the active region.

2. The optoelectronic component as claimed in claim 1, wherein the third semiconductor chip and/or the fourth semiconductor chip have an active region configured to emit electromagnetic radiation having a dominant wavelength ranging from about 430 nm to about 490 nm during operation of the optoelectronic component.

3. The optoelectronic component as claimed in claim 1, wherein the first semiconductor chip, the second semiconductor chip, the third semiconductor chip, and the fourth semiconductor chip are arranged in two rows and two columns on the carrier.

4. The optoelectronic component as claimed in claim 1, wherein the electromagnetic radiation emitted by the first semiconductor chip, the second semiconductor chip, the third semiconductor chip, and the fourth semiconductor chip during operation produces a white mixed light.

5. The optoelectronic component as claimed in claim 4, wherein a color temperature of the white mixed light is adjustable, wherein a color rendering index of the white mixed light is at least 90 for each adjustable color temperature.

6. The optoelectronic component as claimed in claim 4, wherein a color temperature of the white mixed light is adjustable; and wherein the color temperature ranges from 3000 K to 7000 K.

7. The optoelectronic component as claimed in claim 4, wherein a color rendering index Ra of the white mixed light is at least 95.

8. The optoelectronic component as claimed in claim 4, wherein a color rendering index R9 of the white mixed light is at least 93.

9. The optoelectronic component as claimed in claim 1, wherein the first semiconductor chip is configured to emit electromagnetic radiation having a dominant wavelength ranging from about 620 nm to about 640 nm during operation.

10. The optoelectronic component as claimed in claim 1, wherein the second semiconductor chip is configured to emit electromagnetic radiation having a dominant wavelength ranging from about 460 nm to about 465 nm during operation.

11. The optoelectronic component as claimed in claim 1, wherein the first semiconductor chip is free of a conversion layer.

* * * * *